US011589476B2

(12) United States Patent
Ma et al.

(10) Patent No.: US 11,589,476 B2
(45) Date of Patent: Feb. 21, 2023

(54) HYBRID OIL IMMERSION SERVER AND ASSOCIATED COMPUTING RACK

(71) Applicant: Dell Products, L.P., Round Rock, TX (US)

(72) Inventors: Xin Zhi Ma, Shanghai (CN); Nan Wang, Shanghai (CN)

( * ) Notice: Subject to any disclaimer, the term of this patent is extended or adjusted under 35 U.S.C. 154(b) by 0 days.

(21) Appl. No.: 17/061,389

(22) Filed: Oct. 1, 2020

(65) Prior Publication Data

US 2022/0095481 A1 Mar. 24, 2022

(30) Foreign Application Priority Data

Sep. 22, 2020 (CN) ........................ 202011005983.X

(51) Int. Cl.
*H05K 7/20* (2006.01)
*G06F 1/20* (2006.01)

(52) U.S. Cl.
CPC ..... *H05K 7/20236* (2013.01); *H05K 7/20009* (2013.01); *H05K 7/20272* (2013.01); *G06F 1/20* (2013.01); *H05K 7/20727* (2013.01); *H05K 7/20772* (2013.01)

(58) Field of Classification Search
CPC .......... H05K 7/20763–20781; H05K 7/20727; H05K 7/20236; H05K 7/20272; H05K 7/20136; H05K 7/1485; H05K 7/1487–1488
See application file for complete search history.

(56) References Cited

U.S. PATENT DOCUMENTS 7,475,494 B1 * 1/2009 Knight ................. H05K 7/1425 34/209
9,144,179 B2 * 9/2015 Shelnutt ............. H05K 7/20827
9,185,827 B2 * 11/2015 Baerd ................ H05K 7/20272
9,223,360 B2 * 12/2015 Attlesey .................. F28D 15/02
9,451,729 B2 * 9/2016 Bailey .................. H05K 9/0062
10,362,705 B2 * 7/2019 Bailey .................. H05K 7/1487

* cited by examiner

*Primary Examiner* — Zachary Pape

(57) ABSTRACT

A computing system includes a liquid cooled segment and an air cooled segment that are both removably received and secured inside a chassis with a fixed physical arrangement relative to one another. The fluid cooled segment includes an enclosure forming an enclosed space for placement of one or more high heat generating components. The enclosed space being in fluid communication with an inlet tube for receiving a cooling fluid and an outlet tube for expelling the cooling fluid that has been used to cool the high heat generating components. The enclosure includes a leak proof connector configured on the enclosure. The air cooled segment includes one or more reduced heat generating components. The reduced heat generating components are electrically coupled to the high heat generating components through the leak proof connector.

16 Claims, 8 Drawing Sheets

400
422
420
422
450
450
434
444
452
452
418
414
416

HYBRID OIL IMMERSION SERVER AND ASSOCIATED COMPUTING RACK

CROSS REFERENCE TO RELATED APPLICATIONS

This application is related to and claims priority under 35 U.S.C. § 119(b) to Chinese Patent Application No. 202011005983.X, filed Sep. 22, 2020 entitled "Hybrid Oil Immersion Server and Associated Computing Rack." Patent Application No. 202011005983.X is hereby incorporated by reference in its entirety.

FIELD

This disclosure relates generally to computing systems, and more specifically, to systems and methods for a hybrid oil immersion server and an associated computing rack.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware, and software components that may be configured to process, store, and communicate information and may include one or more computer systems, data storage systems, and networking systems.

In recent years, as IHS components such as processors, graphics cards, random access memory (RAM), etc. have increased in clock speed and power consumption, the amount of heat produced by such components during normal operation has also increased. Often, the temperatures of these components need to be kept within a selected range to prevent overheating, instability, malfunction, and damage leading to a shortened component lifespan. Accordingly, cooling systems are often implemented in IHSs to cool certain high heat generating components.

To control the temperature of components of an IHS, one approach has been to implement a "passive" cooling system that serves to reject heat of a component by an airflow driven by one or more system-level air movers (e.g., fans, blowers, etc.). A different approach may include using an "active" cooling system in which a heat-exchanging cold plate is thermally coupled to one or more portions of the IHS, while a chilled liquid is passed through conduits internal to the cold plate to remove heat from those components.

SUMMARY

According to one embodiment, a computing system includes a liquid cooled segment and an air cooled segment that are both removably received and secured inside a chassis with a fixed physical arrangement relative to one another. The fluid cooled segment includes an enclosure forming an enclosed space for placement of one or more high heat generating components. The enclosed space is in fluid communication with an inlet tube for receiving a cooling fluid and an outlet tube for expelling the cooling fluid that has been used to cool the high heat generating components. The enclosure includes a leak proof connector configured on the enclosure. The air cooled segment includes one or more reduced heat generating components, which are electrically coupled to the high heat generating components through the leak proof connector.

According to another embodiment, a computing rack includes a frame structure configured for mounting one or more chassis, Each chassis is configured for removable insertion of a fluid cooled segment and an air cooled segment. The fluid cooled segment includes an enclosure forming an enclosed space for placement of one or more high heat generating components. The enclosed space is in fluid communication with an inlet tube for receiving a cooling fluid and an outlet tube for expelling the cooling fluid that has been used to cool the high heat generating components. A leak proof connector is provided on the enclosure. The air cooled segment includes one or more reduced heat generating components. The reduced heat generating components are electrically coupled to the high heat generating components through the leak proof connector.

According to yet another embodiment, a method includes the steps of mounting a chassis of a computing system such that an opening of the chassis is oriented in a lateral direction. Once mounted, a fluid cooled segment and an air cooled segment of the computing system is inserted in the chassis through the opening. The fluid cooled segment includes an enclosure forming an enclosed space for placement of one or more high heat generating components. The enclosed space is in fluid communication with an inlet tube for receiving a cooling fluid and an outlet tube for expelling the cooling fluid that has been used to cool the high heat generating components. A leak proof connector is provided on the enclosure. The air cooled segment includes one or more reduced heat generating components in which the reduced heat generating components are electrically coupled to the high heat generating components through the leak proof connector.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

Figure 1:
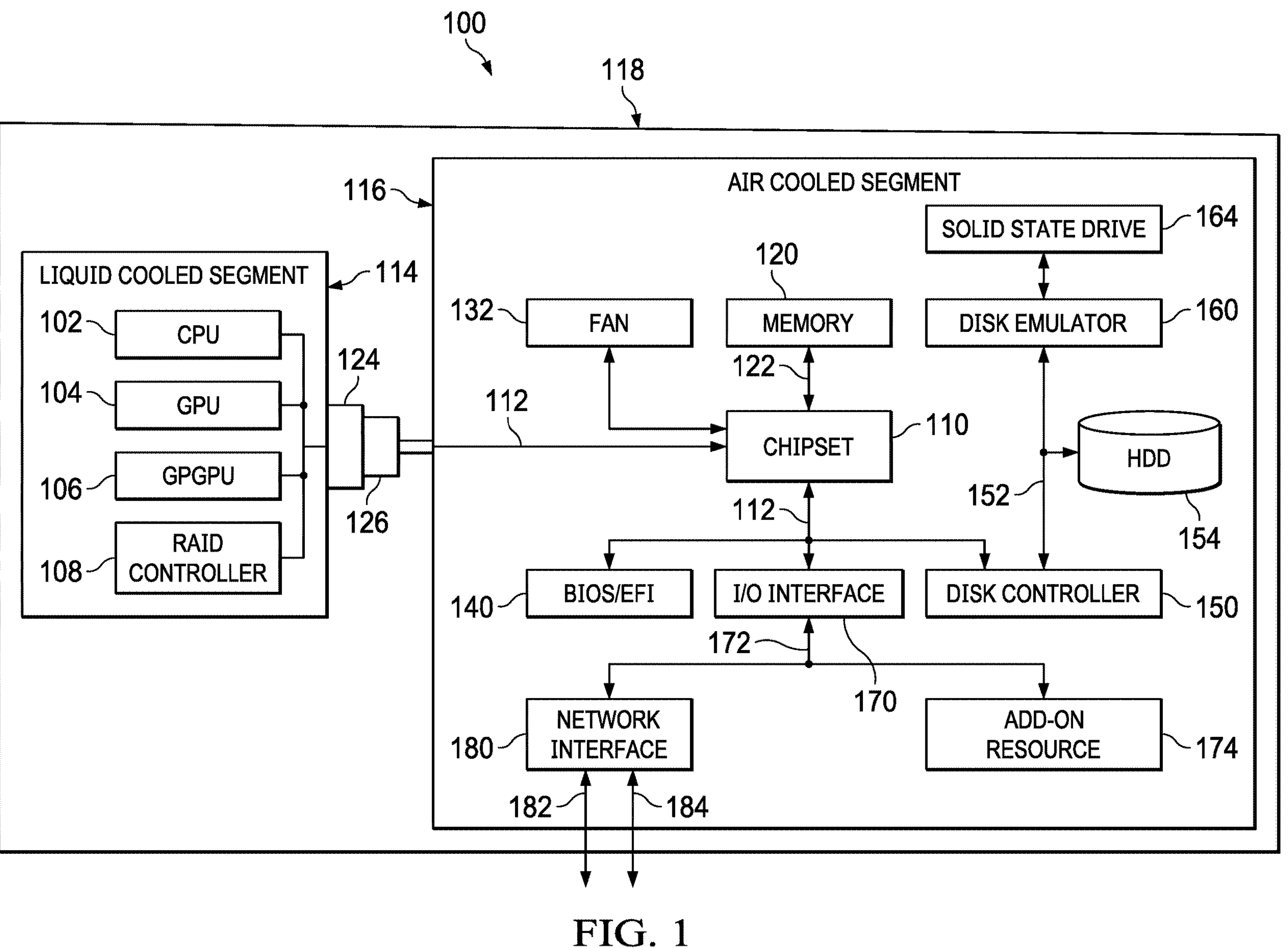
FIG. 1 illustrates an example hybrid oil immersion server that may be implemented according to one embodiment of the present disclosure.

Embodiments of the present disclosure provide a hybrid oil immersion server and an associated computing rack structure that may be used to house the hybrid oil immersion server. The inventors hereof have determined during the development of cooling systems, that a certain portion of the components of a computing system, such as an information handling system (IHS), are predominantly responsible for the overall heat generated by the computing system. As such, a hybrid oil immersion server is provided that includes a liquid cooled segment, and an air cooled segment. The liquid cooled segment is configured for placement and cooling of high heat generating components, that is, those components that generate a relatively high level of heat during normal operation, while the air cooled segment is configured for placement and cooling of reduced heat generating components that generate a relatively lower level of heat. Also provided is a computing rack that may be used to house and operate one or more of the hybrid oil immersion servers.

In current server product design, system integration is continually achieving greater component density, and therefore, heat dissipation problems that have traditionally not been difficult, have now become more and more challenging. As such, optimization of system cooling has become a difficult endeavor. For example, power consumption of the central processing units (CPUs) (e.g., Intel CascadeLake, AMD Rome, etc.) implemented in current mainstream computing systems now typically exceeds 200 Watts. Furthermore, it is estimated that power consumption may become even higher in future product iterations. Similarly, the power consumption of various Peripheral Component Interconnect Express (PCIe) devices is growing very rapidly. For example, it is anticipated that PCIe, version 4.0 devices will be specified to draw more than 300 Watts in total power. Given these figures, the traditional fan cooling solution may no longer be able to meet the demand for heat dissipation of devices such as these, and thus the use of liquid cooling may become an adequate solution.

Conventionally, two main types of liquid cooling have been developed, namely oil immersion, and Direct Contact Liquid Cooling (DCLC). Both of these two solutions, however, have yielded negative impacts on product design when used to provide cooling at adequate cooling levels.

In general, immersion cooling involves a technique in which components and other electronics, including complete servers, are submerged in a thermally conductive dielectric liquid or coolant. Heat is removed from the system by circulating a dielectric liquid in direct contact with heat generating components, followed by cooling of the heated dielectric liquid using heat exchangers. Liquids suitable for immersion cooling should have relatively good insulating properties to ensure that they can safely meet the operational requirements of energized electronic components. Although this cooling method may solve the problem of efficient heat dissipation, it often leads to high system design costs and difficult maintenance issues.

For example, certain computing system (e.g., server) components (e.g., hard disks, etc.) that can be easily damaged often require that the entire computing system be powered off and removed from the liquid during maintenance. This problem is further exacerbated by the fact that the cooling liquid is often required to be totally removed (e.g., evacuated) from the computing system prior to servicing and/or replacing any problematic components. This often results in an excessive amount of time in which the computing system is not available for use. Another problem with this conventional oil immersion technique is that, because the liquid is maintained in an open vat or container, the computing system is often required to be inserted vertically into the container, a practice that is inconsistent with conventional computing system housings, and in particular computing racks, where the computing system is horizontally inserted and removed.

The DCLC approach uses the thermal conductivity of liquid to provide dense, concentrated cooling to specific surface areas of a computing system. Although this approach may solve the heat dissipation problem, it typically requires a relatively large amount of overall system space. Additionally, because the cooling effect is applied to a relatively small region, certain heat dissipation limits can, and often do, exist.

FIG. 1 illustrates an example hybrid oil immersion server 100 that may be implemented according to one embodiment of the present disclosure. The hybrid oil immersion server 100 may include any computing system, such as a rack-mount server, a blade server, bare metal computing device, or any other device that processes instructions stored in a memory. In one embodiment, the hybrid oil immersion server 100 may comprise an information Handling System (IHS) including any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server, rack server, etc.), a network storage device, or any other suitable device and may vary in size, shape, performance, functionality, and price. The IHS may include Random Access Memory (RAM), one or more processing resources such as a Central Processing Unit (CPU) or hardware or software control logic, Read-Only Memory (ROM), and/or other types of nonvolatile memory. Additional components of the IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

In particular, hybrid oil immersion server 100 may include devices, components, or modules that embody one or more of the systems and/or performs one or more of the methods described herein. As shown, hybrid oil immersion server 100 includes one or more central processing units 102, a chipset 110, a memory 120, a basic input and output system/extensible firmware interface (BIOS/EFI) module 140, disk controller 150, a disk emulator 160, an input/output (I/O) interface 170, and a network interface 180.

Memory 120 is connected to chipset 110 via memory bus 122. In a particular embodiment, IHS 100 may include separate memories that are dedicated to each of multiple central processing units 102 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof. The hybrid oil immersion server 100 may also include a fan 132 that may be coupled to, and controlled by chipset 110 for cooling air cooled segment 216.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/EFI module 140 includes BIOS/EFI code operable to, among other things, detect resources within IHS 100, to provide drivers for the resources, initialize the resources, and access the resources.

Disk controller 150 may include a disk interface 152 that connects disc controller 150 to hard disk drive (HDD) 154 and to a disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or any combination thereof. Disk emulator 160 may permit a solid-state drive 164 to be connected to IHS 100. An example of external interface 162 includes a USB interface, an IEEE 1194 (Firewire) interface, a proprietary interface, or a combination thereof. Alternatively, solid-state drive 164 can be disposed within IHS 100.

I/O interface 170 may include a peripheral interface 172 that connects the I/O interface to an add-on resource 174 and to a network interface 180. Peripheral interface 172 can be the same type of interface as I/O channel 112, or can be a different type of interface. As such, I/O interface 170 extends the capacity of I/O channel 112 when peripheral interface 172 and the I/O channel 112 are of the same type, and the I/O interface 170 translates information from a format suitable to the I/O channel 112 to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within IHS 100, a device that is external to the information handling system, or a combination thereof.

Network interface 180 represents a NIC disposed within IHS 100 on a main circuit board of IHS 100, integrated onto another component such as chipset 110, in another suitable location, or a combination thereof. Network interface device 180 includes network channels 182 and 184 that provide interfaces to devices that are external to IHS 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fiber Channel channels, Gigabit Ethernet channels, proprietary channel architectures, or a combination thereof. Network channels 182 and 184 can be connected to external network resources (not illustrated). The network resource can include another IHS, a data storage system, another network, a grid management system, another suitable resource, or a combination thereof.

According to the teachings of the present disclosure, certain high heat generating components of the hybrid oil immersion server 100 may be disposed in a liquid cooled segment 114 while other reduced heat generating components are disposed in an air cooled segment 116 of the hybrid oil immersion server 100. For example, certain components of the computing system 100 (e.g., CPU 102, graphics processing unit (GPU) 104, general purpose computing on graphics processing units (GPGPU) 106, and RAID controller 108) described above typically generate relatively more heat during operation than their reduced heat generating component counterparts (e.g., memory 120, disk emulator 160, hard disk drive 154, disk controller 150, BIOS/EFI 140, I/O interface 170, network interface 180, and add-on resource 174). In fact, certain high heat generating components such as described above may, in certain cases, not function properly when cooled only with conventional air cooling techniques. As such, the high heat generating components are disposed in a liquid cooled segment 114, while the reduced heat generating components are disposed in an air cooled segment 116.

The hybrid oil immersion server 100 also includes a chassis 118 for removably receiving and securing the air cooled segment 116 and liquid cooled segment 114 in a generally fixed physical arrangement relative to one another. The liquid cooled segment 114 includes a leak-proof connector 124 that can be mated with a complementary connector 126 configured on the air cooled segment 116 so that the high heat generating components configured in the liquid cooled segment 114 can be electrically coupled to the reduced heat generating components configured in the air cooled segment 116. As will be described in detail herein below, the liquid cooled segment 114 provides an enclosed space for immersion of the high heat generating components in a cooling liquid, while the air cooled segment 116 provides for air cooling of other reduced heat generating components that emit relatively less heat than their high heat generating component counterparts.

High heat generating components generally refer to those components of a computing system (e.g., IHS) that generate a relatively high level of heat during their operation, while reduced heat generating components generally refer to other components that generate relatively lower levels of heat during their operation. In the particular example embodiment shown, high heat generating components may include CPU 102, GPU 104, GPGPU 106, and RAID controller 108. Nevertheless, it should be appreciated that other high heat generating components may include any component of a computing system that may not be adequately cooled using traditional airflow cooling techniques.

Reduced heat generating components, on the other hand, generally refer to those components that generate relatively lower levels of heat, and as such, can be adequately cooled using traditional air cooling techniques. In the particular example embodiment shown, reduced heat generating components may include chipset 110, memory 120, disk emulator 160, hard disk drive 154, disk controller 150, BIOS/EFI 140, I/O interface 170, network interface 180, and add-on resource 174. Nevertheless, it should be appreciated that reduced heat generating components may include any component of a computing device that can be adequately cooled using air cooling techniques.

The inventors have found during development that a certain portion of the components of a computing device are predominantly responsible for the generation of heat during the operation of that computing device. To solve this problem, conventional oil immersion techniques have been implemented in which the entire computing device is immersed in a liquid (e.g., cooling oil). But this conventional technique creates another problem whereby certain other components, such as hard disk drives, which are relatively more maintenance intensive may not be readily accessible for periodic maintenance. The inventors have found a solution to this problem by forming the computing device with its components arranged in two segments, namely air cooled segment 116 and liquid cooled segment 114, such that high heat generating components disposed in the liquid cooled segment 114 may utilize the enhanced cooling effects of liquid immersion, while other reduced heat generating components may be disposed in the air cooled segment 116 such that it may be separately maintained and/or accessed independently of the liquid cooled segment 114.

Figure 2A:
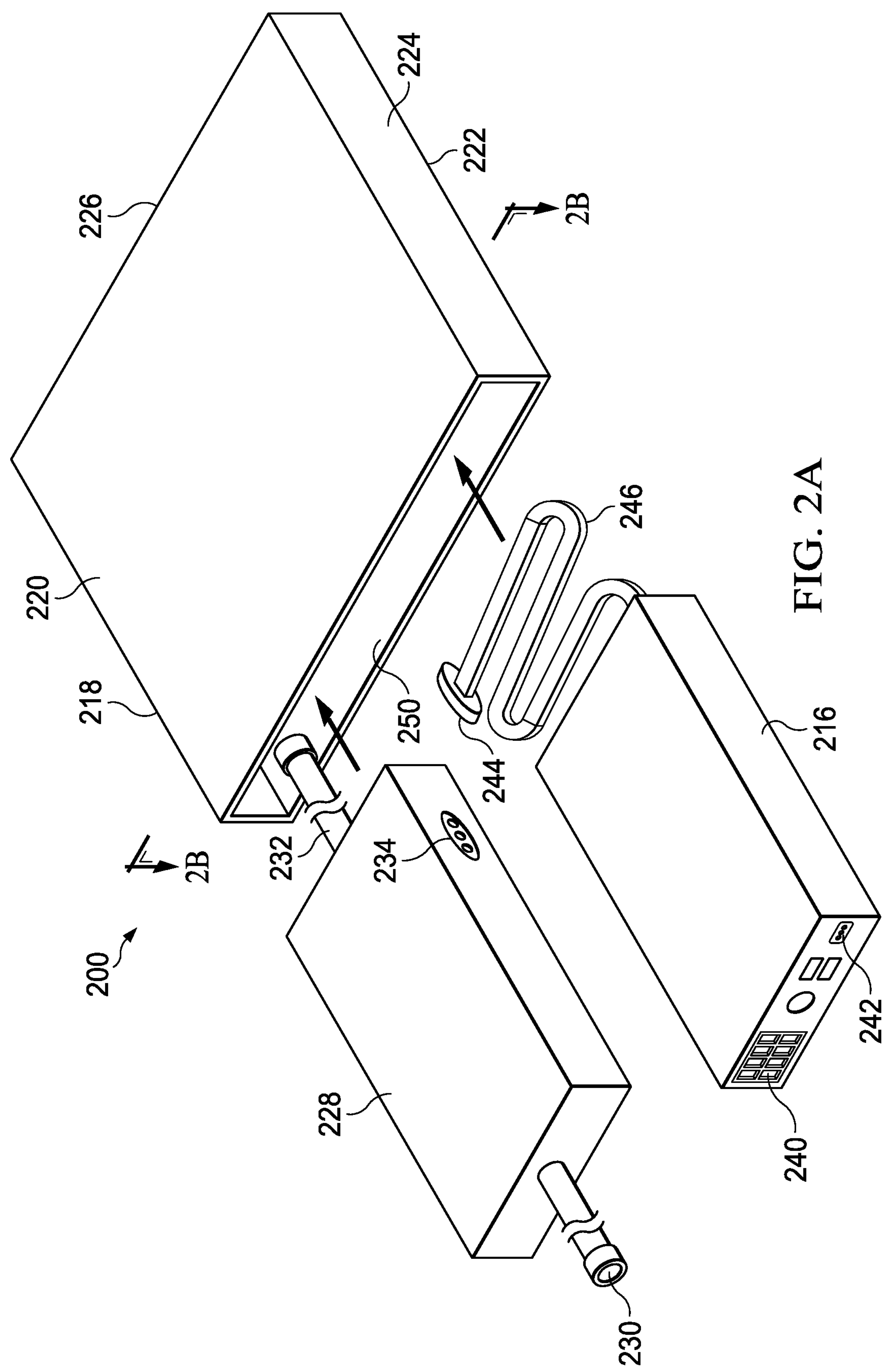
FIGS. 2A and 2B illustrate an example physical arrangement of of the various elements of another embodiment of a hybrid oil immersion server according to one embodiment of the present disclosure.
Figure 2B:
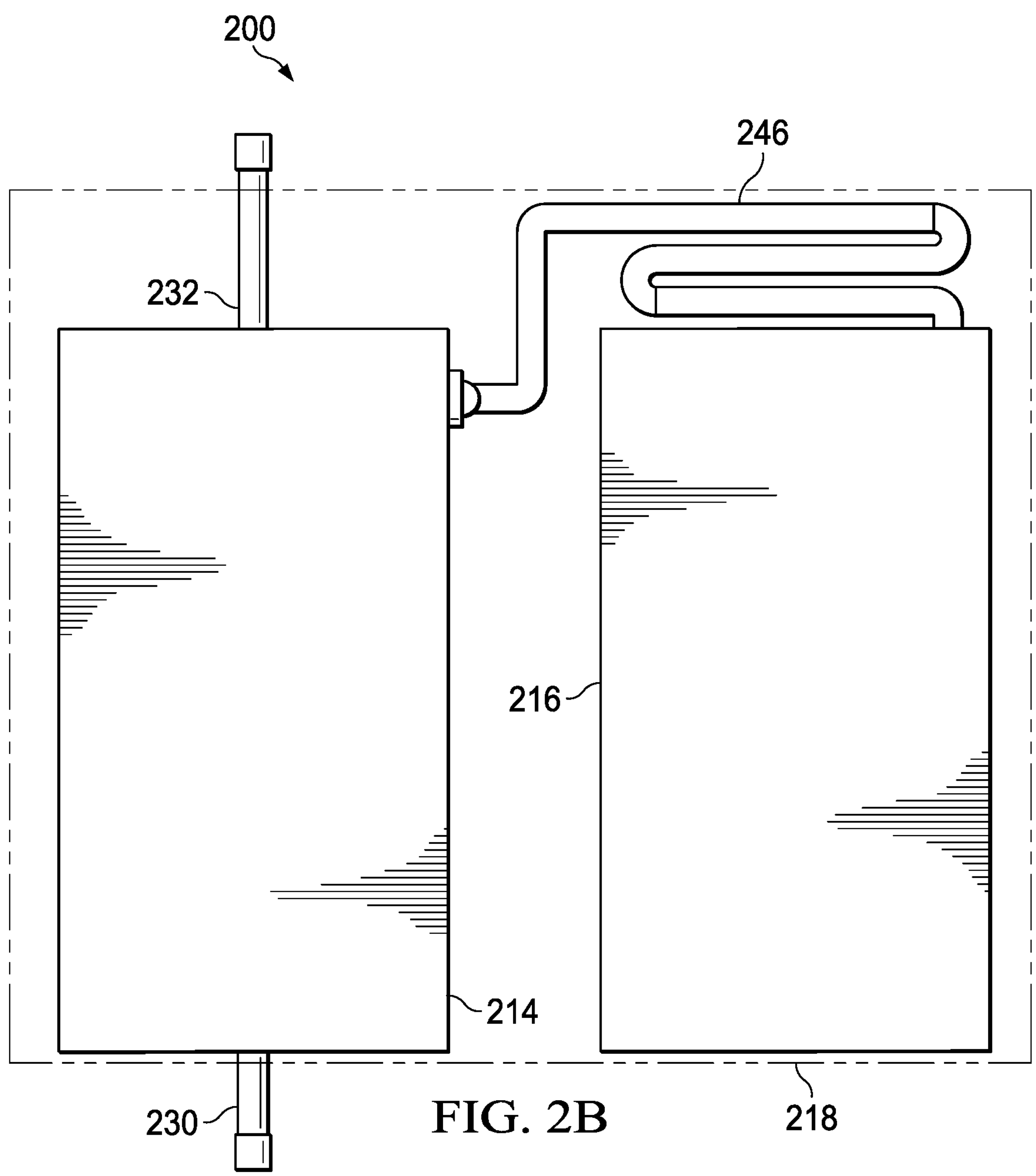

FIGS. 2A and 2B illustrate an example physical arrangement of the various elements of another embodiment of a hybrid oil immersion server 200 according to one embodiment of the present disclosure. Whereas FIG. 2A is a front perspective view of the hybrid oil immersion server 200, FIG. 2B is a plan view taken along the line 2B-2B of FIG. 2A. Hybrid oil immersion server 200 includes an air cooled segment 216 and a liquid cooled segment 214. Air cooled segment 216 includes components similar to those included in air cooled segment 116, while liquid cooled segment 214 includes components similar to those included in liquid cooled segment 114. Air cooled segment 216 and liquid cooled segment 214 are removably received and secured in a chassis 218. FIG. 2A illustrates air cooled segment 216 and liquid cooled segment 214 being physically removed from the chassis, while FIG. 2B illustrates the air cooled segment 216 and liquid cooled segment 214 being in operative engagement inside of the chassis 218.

As shown, chassis 218 includes a top panel 220, a bottom panel 222, two side panels 224, and a rear panel 226 forming a cavity for removably receiving air cooled segment 216 and liquid cooled segment 214. Additionally, because the chassis 218 is void of any front panel, an opening 250 is formed along a front side of the chassis 218 for insertion and removal of air cooled segment 216 and liquid cooled segment 214. Although the example chassis 218 is shown having solid panels that form a box-like shape, it should be appreciated that chassis 218 may have any form that removably receives and secures the air cooled segment 216 and liquid cooled segment 214 in a generally fixed physical arrangement relative to one another. In one embodiment, chassis 218 is dimensioned to fit inside a standard sized computing rack. Additional details of how chassis 218 may be mounted in a computing rack is described in detail herein below. Nevertheless, it should be appreciated that the chassis 218 may have other dimensions if mounting in a computing rack is not needed or desired.

Liquid cooled segment 214 includes an enclosure 228 that forms an enclosed space for housing the high heat generating components of the hybrid oil immersion server 200. The liquid cooled segment 214 also includes an inlet tube 230 and an outlet tube 232 that are both in fluid communication with the enclosed space of the enclosure 228. In operation, chilled liquid is introduced to the enclosed space of the enclosure 228 through the inlet tube 230, while heated liquid which has been heated in order to cool the high heat generating components is retrieved from the outlet tube 232.

Access to the electrical nodes of the high heat generating components may be provided by a leak-proof connector 234 configured on one side panel 224 of the enclosure 218. leak-proof connector 234 may be any type that provides electrical connection to the high heat generating components disposed inside of the enclosure 228 while providing a liquid seal of enclosed space 228 from the ambient environment. In one embodiment, the leak-proof connector 234 includes one that is rated for continuous immersion in a liquid. One example of such a device may include a USB type-C connector, such as one that may be implemented on a waterproof mobile phone. In another embodiment, the leak-proof connector 234 is a type that conforms to, and is compatible with a PCIe bus standard. That is, the leak-proof connector 234 may have a structure suitable for conveying signals that conform to the PCIe bus or other similar high speed computer expansion bus standard.

The air cooled segment 216 may include a grill structure 240, or otherwise a combination of holes, for receiving or expelling air through its inner chamber. The air cooled segment 216 may also include one or more receptacles 242 for providing an electrical connection to a suitable power source, or other computing devices through one or more communications cables, such as USB cables, Ethernet cables, IEEE 1394 cables, and the like. The air cooled segment 216 also includes a complimentary connector 244 that is adapted to be mated with the leak-proof connector 234 configured on the liquid cooled segment 214. The complimentary connector 244 is coupled to the air cooled segment 216 through a cable arm 246 comprising an elongated cable assembly configured with joints so that the complimentary connector 244 may remain connected to leak-proof connector 234 while the air cooled segment 216 is at least partially or fully removed from the chassis 218. In this manner, the enclosure of the air cooled segment 216 can be opened to service and/or replace certain components (e.g., HDD, SSD, OCP, etc.) included in the air cooled segment 216 while the server 200 remains operational (e.g., is still running).

Figure 3A:
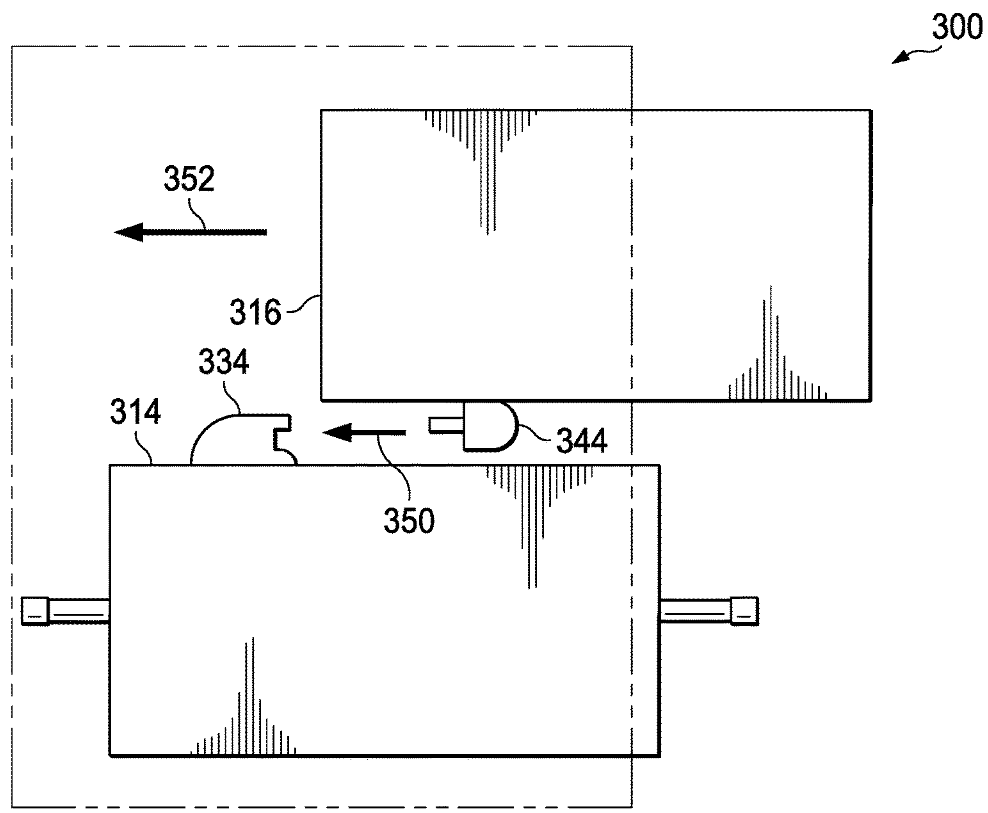
FIGS. 3A and 3B illustrate an example physical arrangement of of the various elements of another embodiment of the hybrid oil immersion server according to one embodiment of the present disclosure.
Figure 3B:
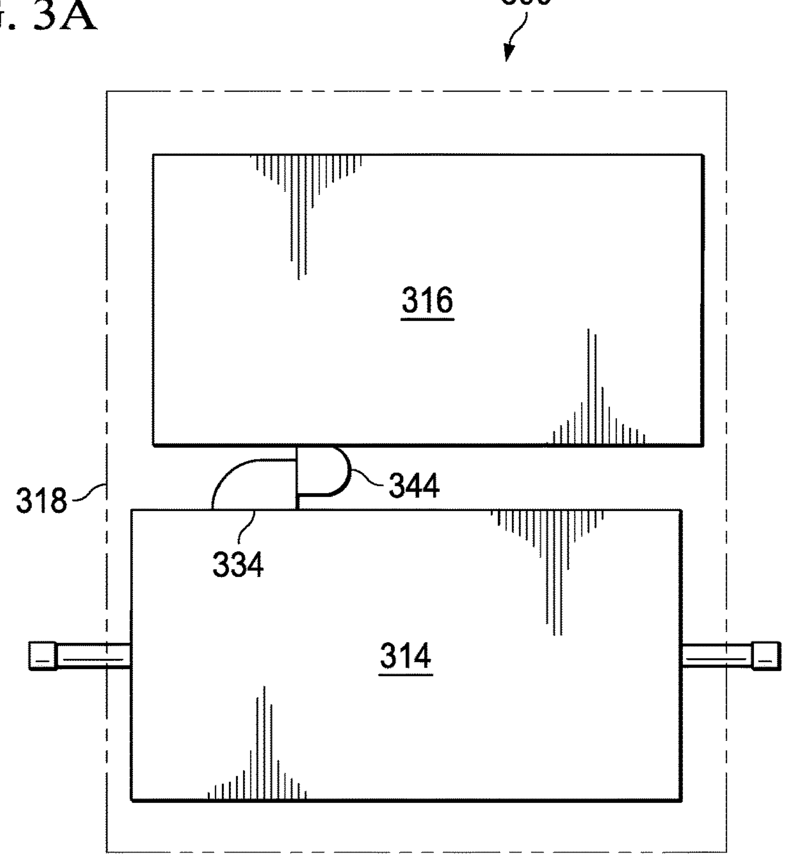

FIGS. 3A and 3B illustrate an example physical arrangement of of the various elements of another embodiment of the hybrid oil immersion server 300 according to one embodiment of the present disclosure. Both FIGS. 3A and 3B show a top view of the hybrid oil immersion server 300 with the top panel of the chassis 318 removed in order to show the position and orientation of air cooled segment 316 and liquid cooled segment 314 in chassis 318. In FIG. 3A, air cooled segment 316 and liquid cooled segment 314 are partially removed from chassis 318, while in FIG. 3B, air cooled segment 316 and liquid cooled segment 314 are both fully inserted inside of chassis 318.

Chassis 318, air cooled segment 316, and liquid cooled segment 314 are similar in design and construction to the chassis 218, air cooled segment 216, and liquid cooled segment 214 of FIGS. 2A and 2B. The liquid cooled segment 314 differs, however, in that a forward facing leak-proof connector 334 is provided in lieu of leak-proof connector 234 of the hybrid oil immersion server 200 of FIGS. 2A and 2B. Additionally, air cooled segment 316 differs in that a rearward facing connector 344 is provided in lieu of the complementary connector 244, cable arm 246 assembly of hybrid oil immersion server 200 of FIGS. 2A and 2B.

As can be seen from FIG. 3A, rearward facing connector 344 configured on the air cooled segment 316 may be engaged with, or otherwise connected to, forward facing leak-proof connector 334 configured on the liquid cooled segment 314 by movement in a connector insertion direction 350. Because the connector insertion direction 350 is essentially parallel to an insertion direction 352 of the air cooled segment 316, the rearward facing connector 344 may be engaged with the forward facing leak-proof connector 334 when the air cooled segment 316 is moved into operative engagement inside of chassis 318. Thus, the hybrid oil immersion server 300 may provide an advantage in that a step of manually engaging a complementary connector on a leak-proof connector configured on the liquid cooled segment 314 prior to inserting the air cooled segment 316 may be reduced or eliminated in some embodiments.

Figure 4A:
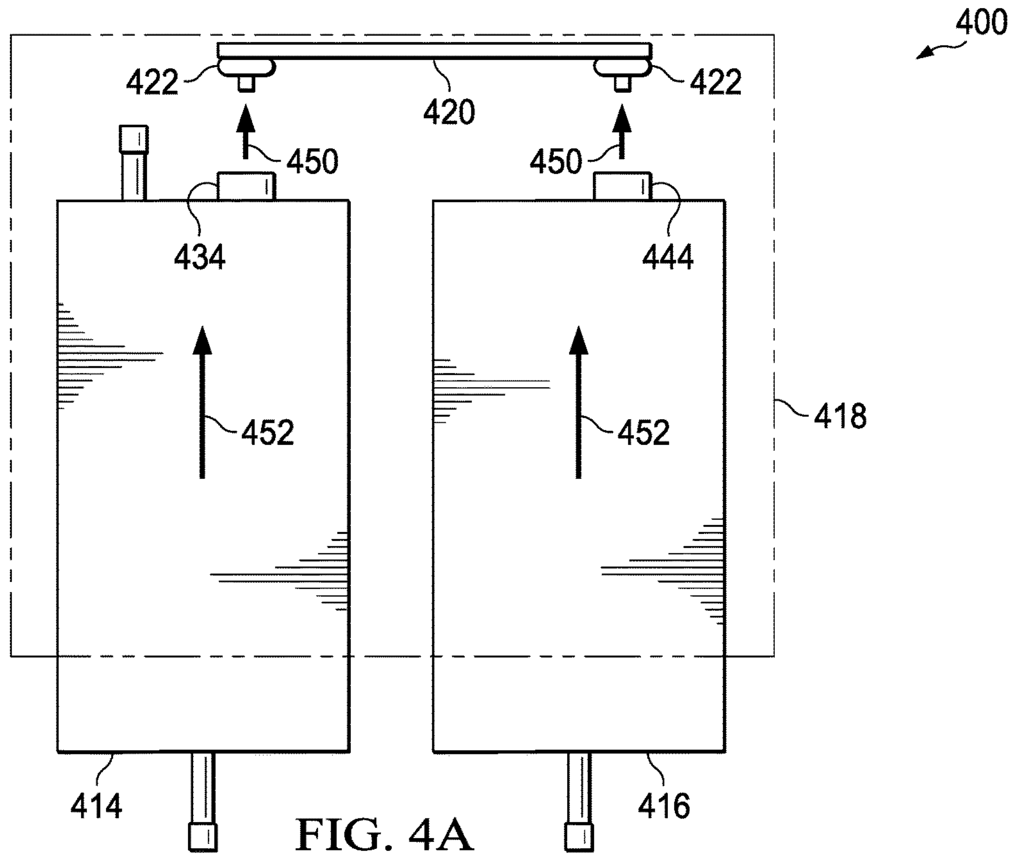
FIGS. 4A and 4B illustrate an example physical arrangement of of the various elements of another embodiment of a hybrid oil immersion server according to one embodiment of the present disclosure.
Figure 4B:
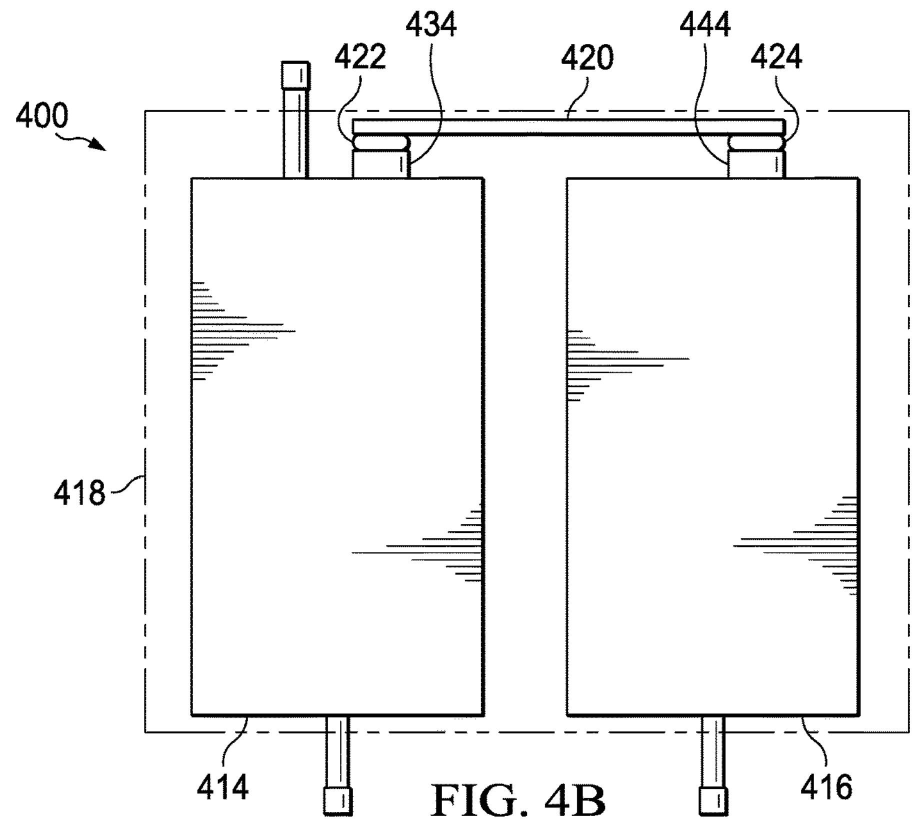

FIGS. 4A and 4B illustrate an example physical arrangement of the various elements of another embodiment of a hybrid oil immersion server 400 according to one embodiment of the present disclosure. Hybrid oil immersion server 400 includes a chassis 418, an air cooled segment 416, and a liquid cooled segment 414 that are similar in design and construction to the chassis 218, air cooled segment 216, and liquid cooled segment 214 of FIGS. 2A and 2B. Chassis 418 differs, however, in that a backplane 420, which provides for electrical interconnection of air cooled segment 416 with liquid cooled segment 414, is provided with two forward facing connectors 422, 424. Additionally, air cooled segment 416 and liquid cooled segment 414 differ in that rearward facing leak-proof connectors 434 and 444 are provided in lieu of leak-proof connector 234 and complementary connector 244, cable arm 246 assembly, respectively, of hybrid oil immersion server 200 of FIGS. 2A and 2B.

Both FIGS. 4A and 4B show a top view of the hybrid oil immersion server 400 with the top panel of the chassis 418 removed in order to show the position and orientation of air cooled segment 416 and liquid cooled segment 414 in chassis 400. In FIG. 4A, air cooled segment 416 and liquid cooled segment 414 are partially removed from chassis 418, while in FIG. 4B, air cooled segment 416 and liquid cooled segment 414 are both fully inserted inside of chassis 418.

As can be seen from FIG. 4A, rearward facing connector 444 configured on air cooled segment 416 may be engaged with, or otherwise connected to, forward facing connector 424 configured on backplane 420 by movement in a connector insertion direction 450. Additionally, rearward facing connector 434 configured on liquid cooled segment 414 may be engaged with, or otherwise connected to, forward facing connector 422 configured on backplane 420 by movement in a connector insertion direction 450. Because the connector insertion direction 450 of air cooled segment 416 is essentially parallel to an insertion direction 452 of the air cooled segment 416, the rearward facing connector 444 may be engaged with the forward facing connector 424 when the air cooled segment 416 is moved into operative engagement inside of chassis 418. Additionally, because the connector insertion direction 450 of liquid cooled segment 414 is essentially parallel to an insertion direction 452 of the liquid cooled segment 414, the rearward facing leak-proof connector 434 may be engaged with the forward facing connector 422 when the air cooled segment 416 is moved into operative engagement inside of chassis 418.

Thus, certain embodiments of the hybrid oil immersion server 400 may provide an advantage in that a step of manually engaging a complementary connector on a leak-proof connector configured on the air cooled segment 416 or liquid cooled segment 414 prior to inserting the air cooled segment 416 may be reduced or eliminated in some embodiments. Additionally, certain embodiments of air cooled segment 416 or liquid cooled segment 414 may be separately inserted into, or removed from, chassis 418 independently each other. That is, liquid cooled segment 414 is configured for removable insertion independently of how the air cooled segment 416 is removably inserted, while air cooled segment 416 is configured for removable insertion independently of how liquid cooled segment 414 is removably inserted.

Figure 5:
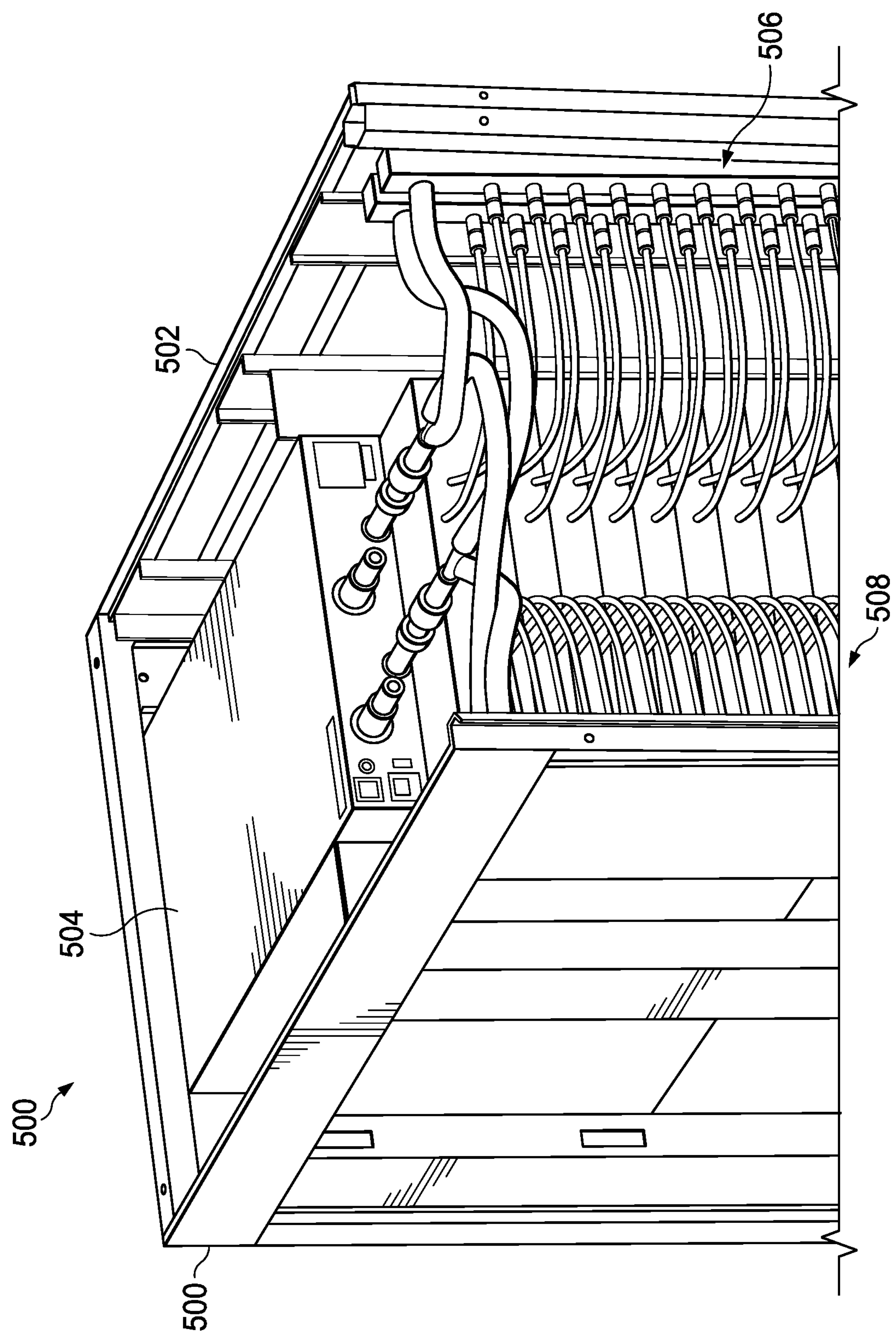
FIG. 5 is a partial, perspective view illustrating an example computing rack that may be used to mount one or more hybrid oil immersion servers according to one embodiment of the present disclosure.

FIG. 5 is a partial, perspective view illustrating an example computing rack 500 that may be used to mount one or more hybrid oil immersion server according to one embodiment of the present disclosure. Computing rack 500 includes a frame structure 502 for mounting multiple hybrid oil immersion servers 200, 300, 400. The frame structure 502 may also be used to mount a liquid recirculation system 504 that pumps chilled liquid through liquid cooled segment 214, 314, 414, and cools heated liquid returned from liquid cooled segment 214, 314, 414.

The chassis 218, 318, 418 of each hybrid oil immersion server 200, 300, 400 may be dimensioned to fit in any suitable type and size of computing rack. Examples of suitable computing racks that chassis 218, 318, 418 may be dimensioned for include those that are generally referred to as 19-inch racks or 23-inch racks. 19-inch racks may be constructed according to various specifications, such as the Electronics Industries Alliance 310-D (EIA 310D) specification. Although 23-inch racks are often used by the telecommunication industry, 19-inch racks may be relatively more common with other computing system implementations. In general, these computing racks typically comprise a structure in which one or more chassis 218, 318, 418 and other equipment modules may be mounted.

Computing rack 500 includes an inlet manifold 506 and an outlet manifold 508. Inlet manifold 506 fluidly couples an outlet of liquid recirculation system 504 to the inlet tube of each liquid cooled segment 214, 314, 414. Outlet manifold 508, on the other hand, fluidly couples an inlet of liquid recirculation system 504 to the outlet tube of each liquid cooled segment 214, 314, 414. Thus, inlet manifold 506 and outlet manifold 508 enable the cooling of multiple liquid cooled segments 214, 314, 414 to be provided by a single cooling source (e.g., liquid recirculation system 504). While all hybrid oil immersion servers configured in computing rack 500 are shown to be provided by a single liquid recirculation system 504, it should be appreciated that, in other embodiments, each liquid cooled segment 214, 314, 414 may be provided individually by a corresponding number of multiple cooling sources, or certain liquid cooled segment 214, 314, 414 may be provided by a first cooling source while other liquid cooled segment 214, 314, 414 are provided by a second cooling source.

Figure 6:
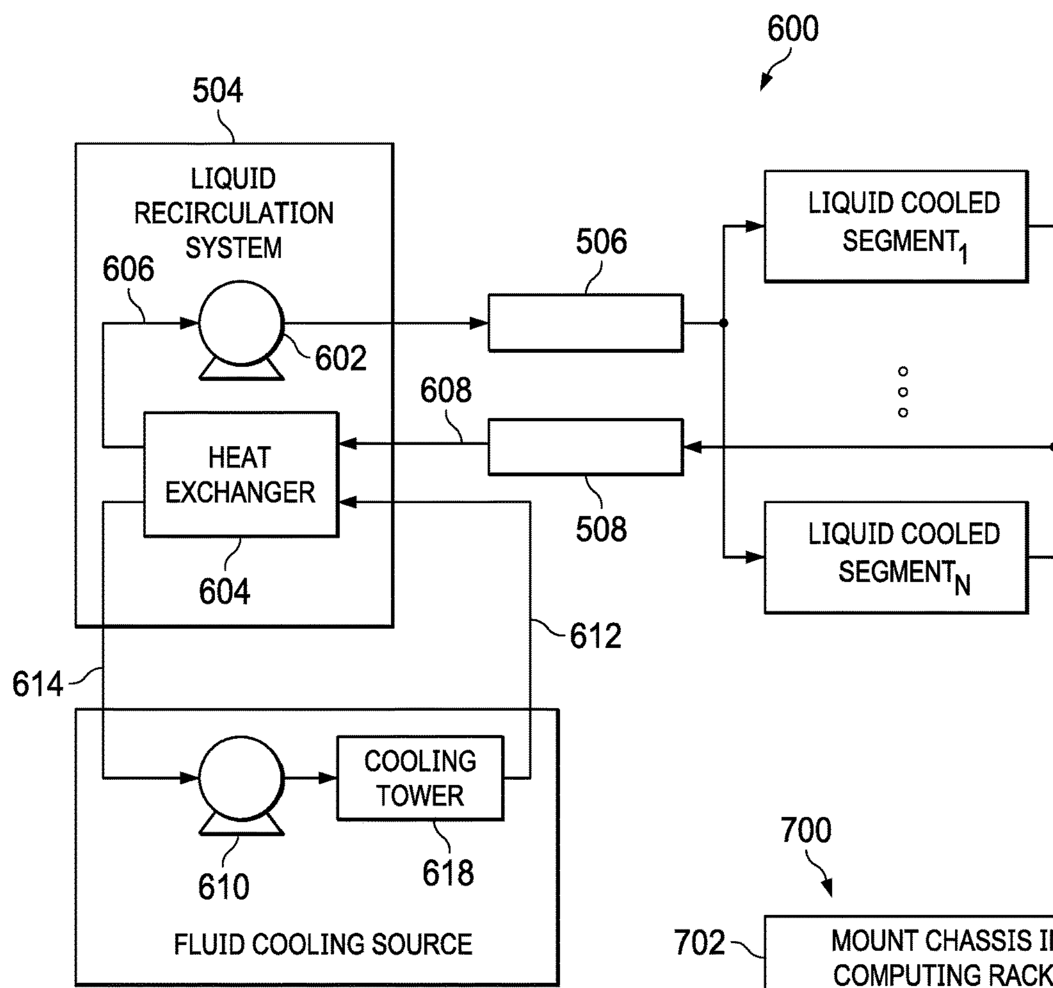
FIG. 6 is a diagram view of a liquid cooled segment cooling system that may be implemented on the computing rack of FIG. 5 according to one embodiment of the present disclosure.

FIG. 6 is a diagram view of the liquid cooled segment cooling system 600 that may be implemented on computing rack 500 of FIG. 5 according to one embodiment of the present disclosure. The system 600 generally includes a liquid recirculation system 504 having a pump 602 and a heat exchanger 604 coupled together as shown. Although the liquid recirculation system 504 as shown with pump 602 and heat exchanger 604, it should be appreciated that the liquid recirculation system 504 may include additional elements, or fewer elements without departing from the spirit and scope of the present disclosure. For example, the liquid recirculation system 504 may include a thermostat that monitors a temperature of the liquid returned from the liquid cooled segment configured on each hybrid oil immersion server 200, 300, 400, and modify a flow rate of the liquid, via pump 602, according to the monitored temperature.

The pump 602 pumps a chilled liquid stream 606 from the heat exchanger 604 to inlet manifold 506 that distributes the chilled liquid stream 606 to each of multiple liquid cooled segments configured on each hybrid oil immersion server 200, 300, 400. The chilled liquid stream 606 is then conveyed through each liquid cooled segment to remove heat from their respective high heat generating components to form a heated liquid stream 608. Heated liquid stream 608 is then collected in outlet manifold 508 and routed to heat exchanger 604. Heated liquid stream 608 is chilled in heat exchanger 604 to form the chilled liquid stream 606 that is again routed through the liquid cooled segments via the pump 602.

Heat exchanger 604 is used to chill heated liquid stream 608 received from the liquid cooled segments of each hybrid oil immersion server 200, 300, 400. Chilling of the heated liquid stream 608 is provided by a secondary pump 610 that pumps a second liquid (e.g., water) to form a second chilled liquid stream 612 that is conveyed through the heat exchanger 604 to chill the primary chilled liquid stream 606. Heat exchanger 604 generates a heated secondary liquid stream 614 that is forced by secondary pump 610 to be chilled in a cooling tower 618 to form the chilled liquid stream 612 that is again sent to heat exchanger 604 for providing further cooling.

The liquid recirculation system 504 of FIG. 5 is provided as an example system that may be used for cooling multiple liquid cooled segments 214, 314, 414 and it should be understood that the system may include additional, fewer, or different elements than what is shown and described herein without departing from the spirit or scope of the present disclosure. For example, heat exchanger 604 and secondary pump 610 may be omitted if the primary cooling liquid is chilled directly via cooling tower 618. Additionally, the system may include a thermostat if regulated temperatures of the liquid cooled segments are needed or desired. As yet an additional example, multiple thermostats may be provided for each of multiple liquid cooled segments in which each thermostat controls actuation of a valve to control a flow rate of the primary liquid to its respective liquid cooled segment according to a measure temperature of its respective liquid cooled segment.

Figure 7:
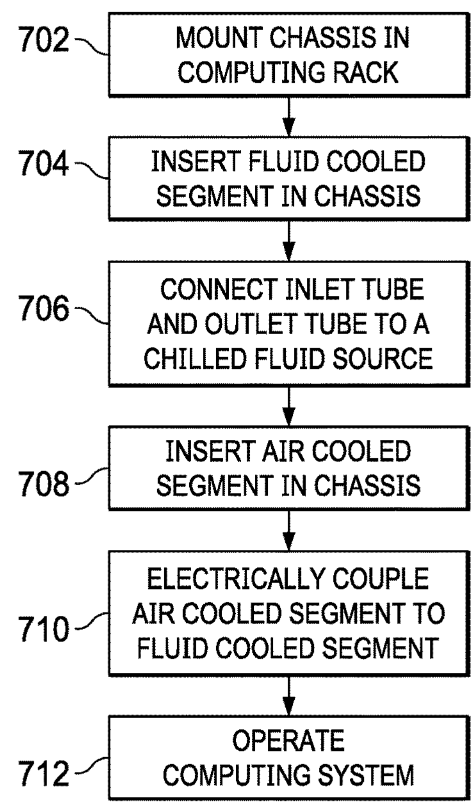
FIG. 7 illustrates a hybrid oil immersion server installation process that can be performed to install or mount a hybrid oil immersion server according to one embodiment of the present disclosure.

FIG. 7 illustrates a hybrid oil immersion server installation process 700 that can be performed to install or mount a hybrid oil immersion server according to one embodiment of the present disclosure.

At step 702, the chassis of the hybrid oil immersion server is mounted such that an opening of the chassis is oriented in a horizontal or lateral direction. Mounting the chassis with its opening in a lateral direction is particularly useful when multiple chassis are installed or otherwise mounted in a standard computing rack. Nevertheless, it should be appreciated that the hybrid oil immersion server may be configured with its opening in any suitable direction, such as vertically, or diagonally. At step 704, the liquid cooled segment is inserted into the chassis, and thereafter at step 706, the inlet tube and the outlet tube are coupled to a chilled liquid source. In one embodiment, the chilled liquid source is a heat exchanger, cooling tower combination that chills the working liquid using a second cooling liquid.

At step 708, air cooled segment is inserted into the chassis. Thereafter at step 710, the air cooled segment is electrically coupled to the liquid cooled segment. That is, the reduced heat generating components of the air cooled segment are electrically coupled to the high heat generating components of the liquid cooled segment via connectors configured on each of the air cooled segment and the liquid cooled segment. From this point forward, the hybrid oil immersion server can be operated in a normal manner. For example, the hybrid oil immersion server may be connected to a source electrical power in addition to any other desired electrical connections, such as Ethernet cables, USB cables, IEEE 1394 cables, and the like, followed by turning the hybrid oil immersion server on, and performing operations on the hybrid oil immersion server as needed or desired. Thereafter at step 712, the computing system is operated in the normal manner.

Thus as can be seen from the foregoing process, the hybrid oil immersion server can take advantage of enhanced cooling provided by use of liquid cooling, while employing the use of standard computing rack mounting techniques. Additionally, because the hybrid oil immersion server is mounted horizontally, greater space saving efficiencies are attained relative to conventional oil immersion techniques in which each server is required to be vertically inserted into a container or vat.

Figure 8:
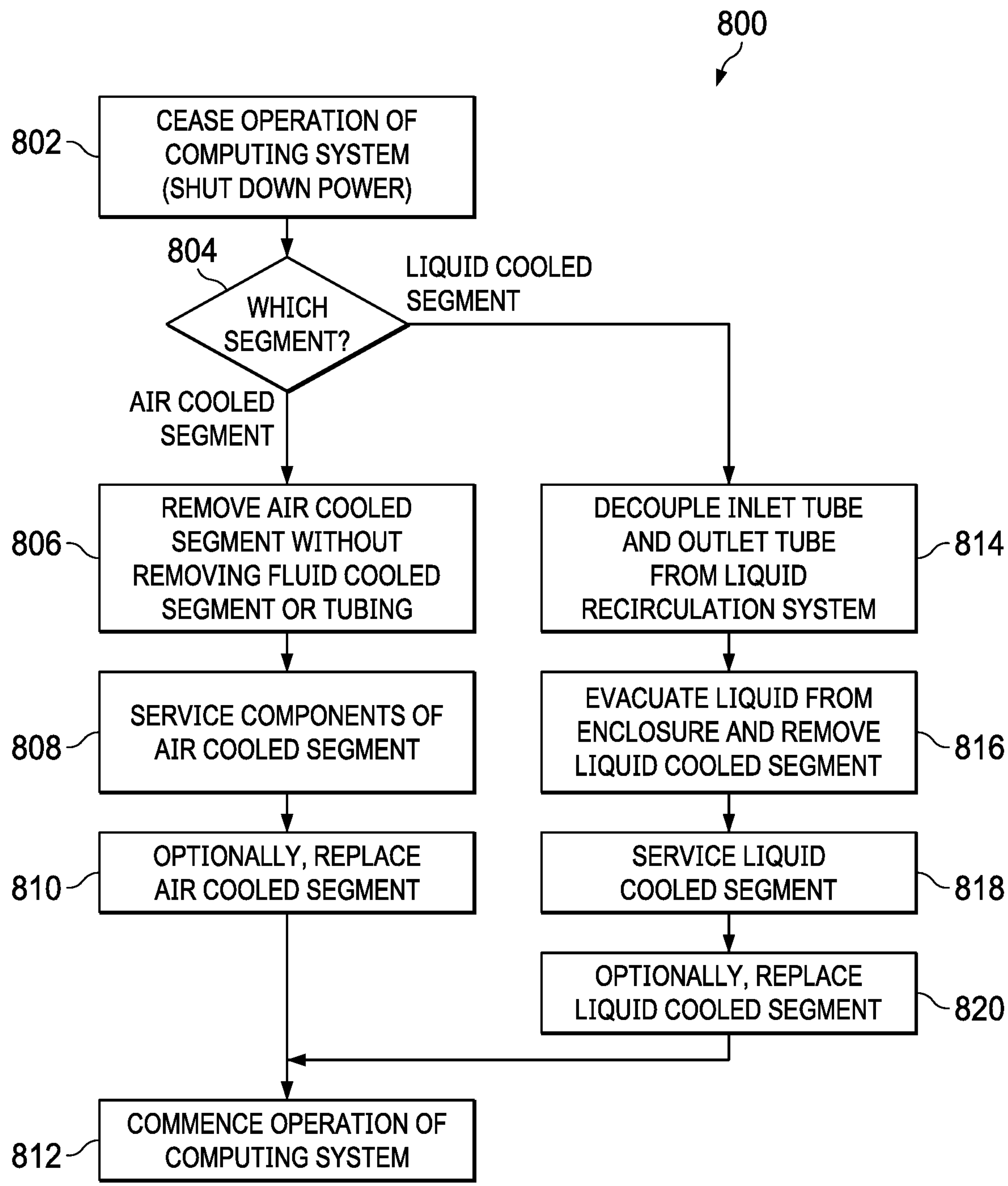
FIG. 8 illustrates a hybrid oil immersion server servicing process that can be performed to service one or more components of the hybrid oil immersion server according to one embodiment of the present disclosure.

FIG. 8 illustrates a hybrid oil immersion server servicing process 800 that can be performed to service one or more components of the hybrid oil immersion server according to one embodiment of the present disclosure. In a particular example, the hybrid oil immersion server servicing process may be performed to provide service or maintenance to one or more maintenance intensive components, such as hard drives or other mechanical devices that require periodic maintenance.

Initially, the hybrid oil immersion server may be installed or otherwise mounted in a horizontal or any suitable orientation such as described above with reference to FIG. 7. At step 802, optionally, operation of the hybrid oil immersion server is stopped. For example, all applications and the operating system running on the hybrid oil immersion server are stopped, and its power switch shut off. Additionally, any electrical connections coupled to the hybrid oil immersion server may be removed. Nevertheless, it should be appreciated that operation of the server does not need to be stopped in some embodiments. For example, the server may include a cable arm such as described above with reference to FIGS. 2A and 2B so that the air cooled segment can be partially or fully removed while the server remains operational.

At step 804, it is determined whether the air cooled segment or the liquid cooled segment are to be serviced. If the air cooled segment is to be serviced, processing continues at step 806. Otherwise, if the liquid cooled segment is to be serviced, processing continues at step 810.

At step 806, the air cooled segment is removed from its associated chassis. Because the chassis has been mounted with its opening in the lateral orientation, the air cooled segment may be one of multiple air cooled segments mounted in a corresponding multiple chassis on a standard computing rack. It is important to note at this point that the liquid cooled segment can remain inside the chassis and its inlet tube and outlet tube connected to its associated liquid cooling source.

At step 808, the air cooled segment is serviced in a normal manner. For example, one or more components configured on the air cooled segment may be repaired or replaced as needed. Furthering this example, a component, such as a newer component having enhanced performance (e.g., a HDD with greater storage capacity) is used to replace an older component configured on the air cooled segment. For another example, the air cooled segment itself may be replaced with another air cooled segment. Thereafter at step 810, the air cooled segment is optionally replaced inside of the chassis. Additionally, air cooled segment may be electrically coupled to the liquid cooled segment through the leak-proof connector. At this point, the hybrid oil immersion server may commence operation in its normal manner. It should be appreciated that the air cooled segment does not need to be replaced in some embodiments. For example, certain components (e.g., HDD, SSD, OCD, etc.) of the air cooled segment may be serviced and/or replaced while the server remains operational if the server includes a cable arm such as described above with reference to FIGS. 2A and 2B. At step 812, operation of the computing system commences.

The steps of 814 through 820 are performed if the liquid cooled segment is to be serviced. At step 814, the inlet tube and outlet tube are decoupled from the liquid recirculation system. At step 816, any liquid present in the enclosure is evacuated, and the liquid cooled segment removed from the chassis. The liquid may be evacuated in any suitable manner. In one example, the liquid may be evacuated by blowing a compressed gas into either of the inlet tube or the outlet tube and retrieving the liquid exiting the other tube in a bottle or other suitable type of container. In another example, plugs may be inserted in one or both of the inlet tube and the outlet tube so that the liquid may be secured in the enclosure, and the liquid evacuated following removal of the liquid cooled segment from the chassis.

At step 818, the liquid cooled segment is serviced in a normal manner. For example, one or more components configured on the liquid cooled segment may be repaired or replaced as needed. As another example, the entire liquid cooled segment may be replaced with another liquid cooled segment. At step 820, the liquid cooled segment is optionally replaced inside of the chassis; and thereafter, operation of the computing system commences again at step 812.

Thus as can be seen from the foregoing description, certain reduced heat generating components can be serviced and or maintained without needing to clean any residual cooling liquid from those components. Thus, performing a maintenance or service procedure may be accomplished in a more timely manner relative to its conventional oil immersion system counterparts. Additionally only those components that would optimally benefit from the enhanced cooling effects of oil immersion are immersed in the cooling liquid in certain embodiments.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterward be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A computing system comprising:

one fluid cooled segment comprising an enclosure forming an enclosed space for placement of one or more high heat generating components, the enclosed space being in fluid communication with an inlet tube for receiving a cooling fluid and an outlet tube for expelling the cooling fluid that has been used to cool the high heat generating components, wherein a leak proof connector is provided on the enclosure; and one air cooled segment comprising one or more reduced heat generating components, wherein the reduced heat generating components are electrically coupled to the high heat generating components through the leak proof connector a chassis for removably receiving and securing the fluid cooled segment and the air cooled segment in a fixed physical arrangement relative to one another, wherein the chassis includes a backplane comprising:

a fluid cooled segment connector for mating with the leak proof connector when the fluid cooled segment is removably inserted in the chassis; and an air cooled segment connector for mating with a complementary connector configured on the air cooled segment when the air cooled segment is removably inserted in the chassis, wherein the fluid cooled segment may be inserted or removed from the chassis independently of when the air cooled segment is inserted or removed, and wherein the one fluid cooled segment and the one air cooled segment collectively form a computing server.

2. The computing system of claim 1, wherein the liquid comprises a dielectric oil that is thermally conductive and electrically insulative.

3. The computing system of claim 1, wherein the leak proof connector is configured for continuous immersion in the fluid.

4. The computing system of claim 1, wherein the fluid cooled segment is configured for removable insertion independently of how the air cooled segment is removably inserted, and wherein the air cooled segment is configured for removable insertion independently of how the fluid cooled segment is removably inserted.

5. The computing system of claim 1, wherein the chassis is dimensioned for placement in a computing rack, and wherein the chassis is configured for removable insertion in the computing rack in a horizontal direction.

6. The computing system of claim 1, further comprising a pump configured to generate a flow of the fluid from the outlet tube to the inlet tube.

7. The computing system of claim 6, further comprising a heat exchanger in fluid communication with the pump and the outlet tube, the heat exchanger fluidly coupled to a second fluid configured to cool the liquid heated by the high heat generating components.

8. A computing rack comprising:

a frame structure configured for mounting one or more chassis, each chassis configured for removable insertion of:

one fluid cooled segment comprising an enclosure forming an enclosed space for placement of one or more high heat generating components, the enclosed space in fluid communication with an inlet tube for receiving a cooling fluid and an outlet tube for expelling the cooling fluid that has been used to cool the high heat generating components, wherein a leak proof connector is provided on the enclosure;

one air cooled segment comprising one or more reduced heat generating components, wherein the reduced heat generating components are electrically coupled to the high heat generating components through the leak proof connector, wherein the one fluid cooled segment and the one air cooled segment collectively form a computing server, and wherein each chassis includes a backplane comprising:

a fluid cooled segment connector for mating with the leak proof connector when the fluid cooled segment is removably inserted in the chassis; and an air cooled segment connector for mating with a complementary connector configured on the air cooled segment when the air cooled segment is removably inserted in the chassis, wherein the fluid cooled segment may be inserted or removed from the chassis independently of when the air cooled segment is inserted or removed.

9. The computing rack of claim 8, further comprising an inlet manifold and an outlet manifold, the inlet manifold fluidly coupling an outlet of a pump to each of the inlet tubes of each fluid cooled segment, the outlet manifold fluidly coupling an inlet of the pump to each of the outlet tubes of each fluid cooled segment.

10. The computing rack of claim 8, further comprising a heat exchanger in fluid communication with a pump and the outlet tube, the heat exchanger fluidly coupled to a second fluid configured to cool the liquid heated by the high heat generating components.

11. The computing rack of claim 10, wherein the cooling fluid comprises a dielectric oil that is thermally conductive and electrically insulative, and wherein the second fluid comprises water.

12. A method comprising:

mounting a chassis of a computing system such that an opening of the chassis is oriented in a lateral direction;

inserting one fluid cooled segment of the computing system in the chassis through the opening, the fluid cooled segment comprising an enclosure forming an enclosed space for placement of one or more high heat generating components, the enclosed space in fluid communication with an inlet tube for receiving a cooling fluid and an outlet tube for expelling the cooling fluid that has been used to cool the high heat generating components, wherein a leak proof connector is provided on the enclosure;

mating a fluid cooled segment connector with the leak proof connector when the fluid cooled segment is removably inserted in the chassis;

inserting one air cooled segment of the computing system in the chassis through the opening, the air cooled segment comprising one or more reduced heat generating components, wherein the reduced heat generating components are electrically coupled to the high heat generating components through the leak proof connector; and mating an air cooled segment connector with a complementary connector configured on the air cooled segment when the air cooled segment is removably inserted in the chassis, wherein the fluid cooled segment may be inserted or removed from the chassis independently of when the air cooled segment is inserted or removed.

13. The method of claim 12, further comprising mounting the chassis in a computing rack.

14. The method of claim 12, further comprising fluidly coupling the inlet tube to an outlet of a chilled fluid source, and fluidly coupling the outlet tube to an inlet of the chilled fluid source.

15. The method of claim 14, further comprising removing the air cooled segment without decoupling the inlet tube from the outlet of the chilled fluid source, or fluidly decoupling the outlet tube from the inlet of the chilled fluid source.

16. The method of claim 12, further comprising removing the air cooled segment without removing the fluid cooled segment.

* * * * *